(12) United States Patent
Que

(10) Patent No.: US 8,951,818 B2
(45) Date of Patent: Feb. 10, 2015

(54) METHOD FOR PREPARING SWITCH TRANSISTOR AND EQUIPMENT FOR ETCHING THE SAME

(71) Applicant: Shenzhen China Star Optoelectronics Technology Co., Ltd., Shenzhen, Guangdong (CN)

(72) Inventor: Xiangdeng Que, Shenzhen (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 149 days.

(21) Appl. No.: 13/704,990

(22) PCT Filed: Nov. 28, 2012

(86) PCT No.: PCT/CN2012/085393
§ 371 (c)(1),
(2) Date: Dec. 18, 2012

(87) PCT Pub. No.: WO2014/079082
PCT Pub. Date: May 30, 2014

(65) Prior Publication Data
US 2014/0141573 A1 May 22, 2014

(30) Foreign Application Priority Data
Nov. 21, 2012 (CN) .......................... 2012 1 0476822

(51) Int. Cl.
*H01L 21/00* (2006.01)
*H01L 21/84* (2006.01)
*H01L 29/66* (2006.01)

(52) U.S. Cl.
CPC ............... *H01L 29/66765* (2013.01)
USPC ............ 438/30; 438/149; 438/151; 438/706; 257/E29.113; 257/E29.325

(58) Field of Classification Search
CPC ................................................... H01L 29/6675
USPC ............ 438/30, 149, 151, 706; 257/E29.113, 257/E29.325
See application file for complete search history.

(56) References Cited

U.S. PATENT DOCUMENTS 5,273,609 A * 12/1993 Moslehi .................. 156/345.28
2007/0224547 A1 * 9/2007 Kido ............................. 430/322

\* cited by examiner

*Primary Examiner* — Michelle Mandala
(74) *Attorney, Agent, or Firm* — Andrew C. Cheng

(57) ABSTRACT

The present invention discloses a method for preparing switch transistor comprising: sequentially forming a control electrode, an insulation layer, an active layer, and a source/drain metal layer of the switch transistor on a glass substrate; patterning the source/drain metal layer to expose the active layer; and proceeding an etching process to the exposed active layer in a way of gradually reducing etching rate to form a channel of the switch transistor. The present invention further discloses an equipment for etching the switch transistor. In the way mentioned above, the present invention can minimize the damages to the switch transistor and improve the reliability of the switch transistor.

8 Claims, 6 Drawing Sheets

METHOD FOR PREPARING SWITCH TRANSISTOR AND EQUIPMENT FOR ETCHING THE SAME

BACKGROUND OF THE INVENTION

1. Field of the Invention

The present invention relates to a liquid crystal panel production technology, and in particular to a switch transistor and an equipment for etching the same.

2. The Related Arts

In the production of the thin film transistor (TFT), 5 times lithography process, which compares with 7 times lithography process, has shorter production cycle and higher yield, which can reduce the exposing number of forming TFT array. Therefore, in the present production of TFT-LCD, 5 times lithography process is usually used to prepare the TFT. 5 times lithography process generally comprises back channel etching TFT and etch stop TFT, wherein the process of the back channel etching TFT is simpler than that of the etch stop TFT and more suitable for mass production.

Referring to FIG. 1, in the process of the back channel etching TFT, after sequentially forming a gate 2, an insulation layer 3, an a-Si layer 4, an n+ a-Si layer 5, and a source/drain metal layer 6 of the TFT on a glass substrate 1, etch the a-Si layer 4 and the n+ a-Si layer 5 to form a channel 7 of the TFT.

Wherein, one step etching method is used in etching process of the channel 7 of the TFT. By using the same gas flow, the same power and the same pressure, the a-Si layer 4 and the n+ a-Si layer 5 are etched in one step. Moreover, the same parameters are used while over etching, so that the etching energy in the etching process of the channel 7 is too powerful. Therefore, the channel 7 will be bombarded by dry etching plasma, and the a-Si layer 4 is easy to be destroyed, leading to the poor electrical properties of the TFT. Secondly, the channel 7 is exposed outermost after the channel 7 is formed, so that the channel 7 will be bombarded by the plasma from chemical vapor deposition (CVD) in the process of forming silicon nitride, further leading to the poorer electrical properties of the TFT.

SUMMARY OF THE INVENTION

To solve the technical issue in the known technology, the present invention provides a method for preparing switch transistor and an equipment for etching the same, which can minimize the damages to the switch transistor and improve the electrical properties of the switch transistor.

To solve the technical issue mentioned above, the present invention provides: a method for preparing switch transistor, comprising: sequentially forming a control electrode, an insulation layer, an active layer, and a source/drain metal layer of the switch transistor on a glass substrate: patterning the source/drain metal layer to expose the active layer and correspondingly forming an input electrode and an output electrode of the switch transistor; and proceeding an etching process to the exposed active layer in a way of gradually reducing etching rate to form a channel of the switch transistor; wherein, the etching process is a dry plasma etching, the switch transistor is a thin film transistor, the control electrode of the switch transistor is corresponding to a gate of the thin film transistor, and the input electrode and the output electrode are a source and a drain of the thin film transistor, respectively.

Wherein, the active layer comprises an amorphous silicon layer adjacent to the insulation layer and an n+ amorphous silicon layer formed on the amorphous silicon layer; and the step of patterning the source/drain metal layer to expose the active layer comprises: patterning the source/drain metal layer to expose the n+ amorphous silicon layer.

Wherein, the step of proceeding an etching process to the exposed active layer in a way of gradually reducing etching rate comprises: using a plasma etching with first energy to each the exposed n+ amorphous silicon layer to expose the amorphous silicon layer; using a plasma etching with second energy to etch the exposed amorphous silicon layer to remove a part of the amorphous silicon layer; wherein the second energy is less than the first energy, which gradually reduces the etching rate.

Wherein, the step of using a plasma etching with second energy to etch the exposed amorphous silicon layer comprises: reducing the required power of the plasma etching to etch the exposed amorphous silicon layer by the plasma etching with second energy.

Wherein, the step of proceeding an etching process to the exposed active layer in a way of gradually reducing etching rate comprises: using a plasma etching with first concentration to etch the exposed n+ amorphous silicon layer to expose the amorphous silicon layer; using a plasma etching with second concentration to etch the exposed amorphous silicon layer to remove a part of the amorphous silicon layer: wherein the second concentration is less than the first concentration, which gradually reduces the etching rate.

Wherein, the step of using a plasma etching with second concentration to etch the exposed amorphous silicon layer comprises: reducing the gas flow of the etching gas of the plasma etching to etch the exposed amorphous silicon layer by the plasma etching with second concentration.

To solve the technical issue mentioned above, the present invention further provides: a method for preparing switch transistor comprising: sequentially forming a control electrode, an insulation layer, an active layer, and a source/drain metal layer of the switch transistor on a glass substrate; patterning the source/drain metal layer to expose the active layer and correspondingly forming an input electrode and an output electrode of the switch transistor; and proceeding an etching process to the exposed active layer in a way of gradually reducing etching rate to form a channel of the switch transistor.

Wherein, the active layer comprises an amorphous silicon layer adjacent to the insulation layer and an n+ amorphous silicon layer formed on the amorphous silicon layer; and the step of patterning the source/drain metal layer to expose the active layer comprises: patterning the source/drain metal layer to expose the n+ amorphous silicon layer.

Wherein, the step of proceeding an etching process to the exposed active layer in a way of gradually reducing etching rate comprises: using a plasma etching with first energy to etch the exposed n+ amorphous silicon layer to expose the amorphous silicon layer; using a plasma etching with second energy to etch the exposed amorphous silicon layer to remove a part of the amorphous silicon layer; wherein the second energy is less than the first energy, which gradually reduces the etching rate.

Wherein, the step of using a plasma etching with second energy to etch the exposed amorphous silicon layer comprises: reducing the required power of the plasma etching to etch the exposed amorphous silicon layer by the plasma etching with second energy.

Wherein, the step of proceeding an etching process to the exposed active layer in a way of gradually reducing etching rate comprises: using a plasma etching with first concentration to etch the exposed n+ amorphous silicon layer to expose the amorphous silicon layer; using a plasma etching with second concentration to etch the exposed amorphous silicon layer to remove a part of the amorphous silicon layer; wherein the second concentration is less than the first concentration, which gradually reduces the etching rate.

Wherein, the step of using a plasma etching with second concentration to etch the exposed amorphous silicon layer comprises: reducing the gas flow of the etching gas of the plasma etching to etch the exposed amorphous silicon layer by the plasma etching with second concentration.

To solve the technical issue mentioned above, the present invention further provides: an equipment for etching switch transistor, which is used to etch an active layer of the switch transistor in a process for preparing the switch transistor, comprising: an etching device, which is used to etch the active layer of the switch transistor to form a channel of the switch transistor; a control device, which is used to control the etching rate of the etching device, so that the etching device can etch the active layer in a way of gradually reducing etching rate.

Wherein, the active layer comprises an amorphous silicon layer and an n+ amorphous silicon layer formed on the amorphous silicon layer; the control device is specifically used to control the etching device to generate a plasma with first energy, which is used to etch the n+ amorphous silicon layer to expose the amorphous silicon layer; the control device is specifically used to control the etching device to generate a plasma with second energy after exposing the amorphous silicon layer, which is used to etch the exposed amorphous silicon layer to remove a part of the amorphous silicon layer: the second energy is less than the first energy, which gradually reduces the etching rate.

Wherein, the control device comprises a first control module which is used to control the power required for the etching device generating the plasma, which allows the etching device to generate the plasma with various energy.

Wherein, the active layer comprises an amorphous silicon layer and an n+ amorphous silicon layer formed on the amorphous silicon layer; the control device is specifically used to control the etching device to generate a plasma with first concentration, which is used to etch the n+ amorphous silicon layer to expose the amorphous silicon layer; the control device is specifically used to control the etching device to generate a plasma with second concentration after exposing the amorphous silicon layer, which is used to etch the exposed amorphous silicon layer to remove a part of the amorphous silicon layer; the second concentration is less than the first concentration, which gradually reduces the etching rate.

The embodiment according to the present invention has the beneficial effects as follows. In the method for preparing switch transistor according to the present invention, the active layer is etched in the way of gradually reducing etching rate, instead of in one etching step, to form a channel of the switch transistor. During the process of gradually reducing etching rate, the etching strength to the active layer decreases gradually, which can minimize the damages to the switch transistor and improve the reliability of the switch transistor.

DETAILED DESCRIPTION OF THE PREFERRED EMBODIMENTS

The detailed descriptions accompanying drawings and the preferred embodiment of the present invention are as follows.

Figure 1:
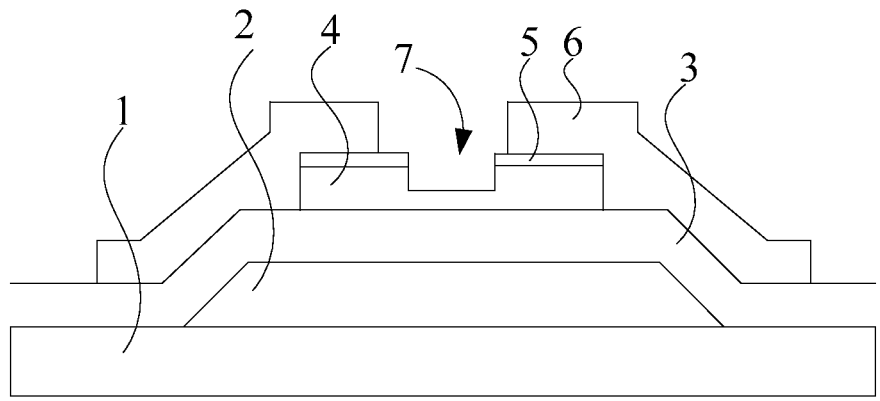
FIG. 1 is a schematic view illustrating the structure of the TFT prepared using one step etching method according to the known technology.
Figure 2:
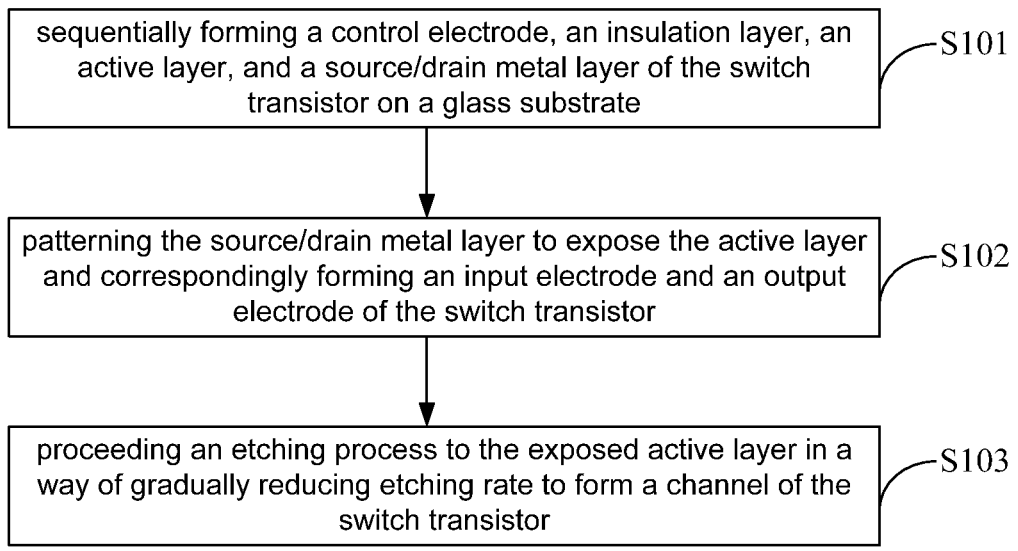
FIG. 2 is a flow chart of the method for preparing switch transistor according to one embodiment of the present invention.
Figure 3:
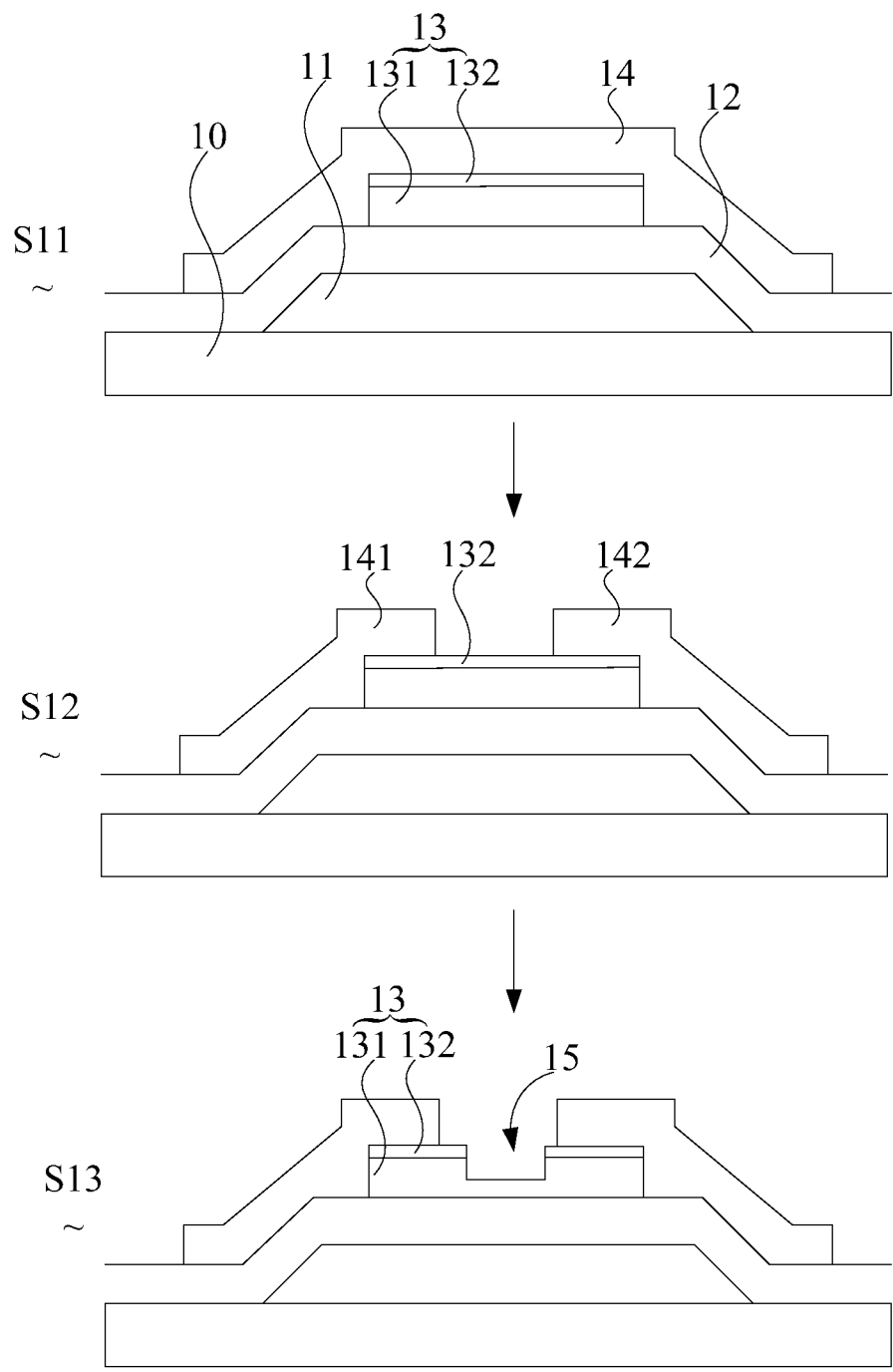
FIG. 3 is a schematic view illustrating the method for preparing switch transistor according to one embodiment of the present invention.

Referring to FIG. 2 and FIG. 3, the method for preparing switch transistor according to one embodiment of the present invention is as follows.

Step 101: sequentially forming a control electrode, an insulation layer 12, an active layer 13, and a source/drain metal layer 14 of the switch transistor on a glass substrate 10.

The switch transistor is a control switch with three terminals. In order to clearly illustrate the production process of the switch transistor according to the present invention, the description accompanying the schematic view shown in FIG. 3 is as follows. In step S11 shown in FIG. 3, after cleaning and drying the glass substrate 10, sputter a metal layer on the glass substrate 10, and then pattern the metal layer to form the control electrode 11 of the switch transistor. After that, sequentially form the insulation layer 12, the active layer 13, and the source/drain metal layer 14 on the control electrode 11. Wherein, the insulation layer 12 is usually silicon nitride, which is used to separate the active layer 13 and the control electrode 11 and allows the switch transistor having higher input resistance; the active layer 13 is mainly used to control power-on and power-off of the switch transistor; the source/drain metal layer 14 is used to form input electrode and output electrode of the switch transistor, which is selected from the group consisting of aluminum alloy, metallic aluminum or metallic chromium.

Step S102: patterning the source/drain metal layer 14 to expose the active layer 13 and correspondingly forming an input electrode 141 and an output electrode 142 of the switch transistor.

Corresponding to the step S12 shown in FIG. 3, after proceeding the patterning process, such as photoresist coating, exposure, etching, and photoresist stripping, to the active layer 14, correspondingly form the input electrode 141 and the output electrode 142 of the switch transistor and expose a part of the active layer 13. The active layer according to the present invention specifically comprises an amorphous silicon layer 131 adjacent to the insulation layer 12 and an n+ amorphous silicon layer 132 formed on the amorphous silicon layer 131. Wherein, the amorphous silicon layer 131 is the core layer of the switch transistor, which mainly decides the electrical properties and function of the switch transistor. The n+ amorphous silicon layer 132 is a doped semiconductor layer used to improve the ohmic contact within the amorphous silicon layer 131, the input electrode 141 and the output electrode 142. After forming the input electrode 141 and the output electrode 142, expose the corresponding part of the n+ amorphous silicon layer 132.

Wherein, the switch transistor is a thin film transistor, the control electrode 11 of the switch transistor is corresponding to a gate of the thin film transistor, and the input electrode 141 and the output electrode 142 are a source and a drain of the thin film transistor, respectively. The switch transistor also can be other three-terminal type control switch, such as triode, which is not limited.

Step S103: proceeding an etching process to the exposed active layer in a way of gradually reducing etching rate to form a channel of the switch transistor Corresponding to the step S13 shown in FIG. 3, it shows the dry etching in a way of gradually reducing etching rate proceeded to the active layer 13 to form a channel 15 of the switch transistor. In the present invention, a dry plasma etching is used to etch the active layer 13. The dry plasma etching is a physical sputtering process accompanying chemical reaction. It mainly uses a chemically reactive gas to generate a chemically active plasma, which allows the high energy plasma accelerated by the electric field to bombard the etched material to remove the unwanted material.

Figure 4:
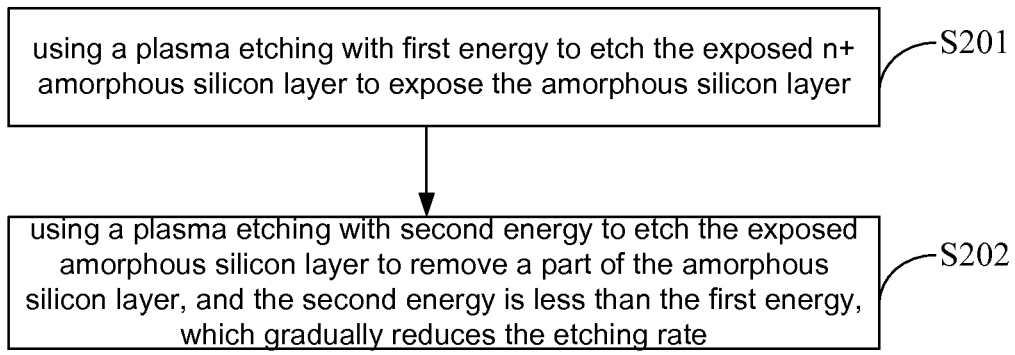
FIG. 4 is a flow chart of the step of proceeding an etching process to the exposed active layer in a way of gradually reducing etching rate according to one embodiment in FIG. 2.
Figure 5:
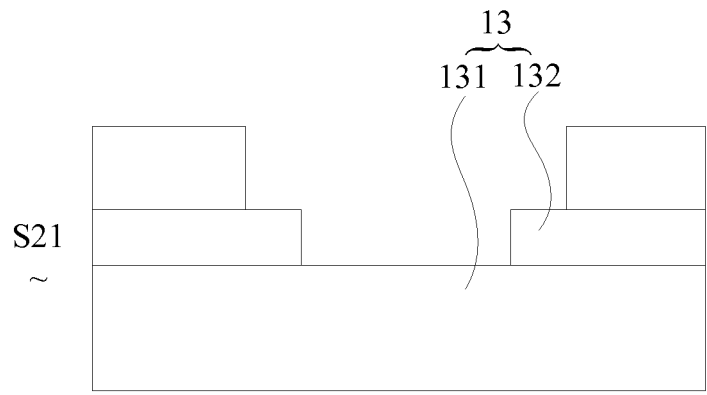
FIG. 5 is a schematic view illustrating the step of proceeding an etching process to the exposed active layer in a way of gradually reducing etching rate in the production of the switch transistor according to one embodiment of the present invention.
Figure 5:
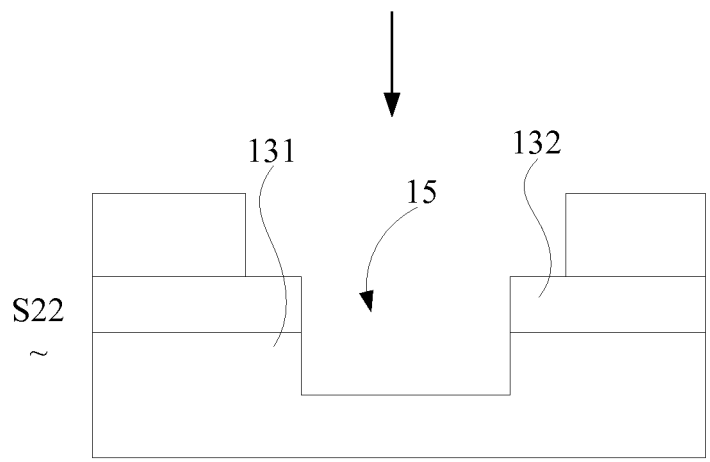

Specifically, the dry etching proceeded to the active layer 13 according to the present invention comprises two steps and gradually reduces the etching rate by gradually reducing the energy of the plasma. Referring to FIG. 4 and FIG. 5, the step of proceeding an etching process to the exposed active layer 13 in a way of gradually reducing etching rate is as follows.

Step S201: using a plasma etching with first energy to etch the exposed n+ amorphous silicon layer 132 to expose the amorphous silicon layer 131.

In step S102, pattern the source/drain metal layer 14 to expose the n+ amorphous silicon layer 132 of the active layer 13. Corresponding to the step S21 shown in FIG. 5, the step S201 is first etching of the active layer 13, which bombards the exposed the n+ amorphous silicon layer 132 by plasma to remove a part of the n+ amorphous silicon layer 132, and then the amorphous silicon layer 131 corresponding to the removed n+ amorphous silicon layer 132 is exposed. Wherein, the plasma removing the n+ amorphous silicon layer 132 has a first energy. By adjusting the related parameters of plasma generating equipment, such as the power density of the plasma, the plasma has a corresponding bombarding energy to etch the active layer 13. The power density corresponding to the first energy is as follows: the power density of source RF is between 0.07~0.1 W/cm$^2$, such as 0.08 W/cm$^2$; the power density of bias RF is between 0.05~0.08 W/cm$^2$, such as 0.07 W/cm$^2$. In particular, it may be adjusted according to actual needs and not to be limited here.

Step S202: using a plasma etching with second energy to etch the exposed amorphous silicon layer 131 to remove a part of the amorphous silicon layer 131. The second energy is less than the first energy, which gradually reduces the etching rate.

In step S201, pattern the active layer 13 to expose the amorphous silicon layer 131 below the n+ amorphous silicon layer 132, and then proceed second etching process to the active layer 13. Referring to the step S22 shown in FIG. 5, the etching plasma obtains the second energy to etch the exposed amorphous silicon layer 131 to remove a part of the amorphous silicon layer 131 by adjusting the desired power density of the plasma, and then form the channel 15 of the switch transistor. Specifically, the power density corresponding to the second energy is as follows: the power density of source RF is between 0.05~0.07 W/cm$^2$, such as 0.05 W/cm$^2$; the power density of bias RF is between 0.03~0.05 W/cm$^2$, such as 0.04 W/cm$^2$. In particular, it may be adjusted according to actual needs. Wherein, the second energy is less than the first energy, which gradually reduces the etching rate of the active layer 13 and avoids damaging the amorphous silicon layer 131 due to high energy plasma in the second etching process. The plasma with second energy can be obtained by reducing the desired power of the plasma generating equipment.

For example, before etching the exposed active layer 13, the thickness of the n+ amorphous silicon layer 132 is 400 Å, and the thickness of the amorphous silicon layer 131 is 1300 Å. The plasma generating equipment is dual RF source plasma etching equipment. When proceeding the first etching process to the active layer 13, that is, etching the exposed n+ amorphous silicon layer 132, the power of the source RE of the plasma generating equipment is 4000 W, and the power of the bias RF is 3000 W, which allows the generated plasma to obtain the first energy. The etching time is set for 20 seconds, which ensures the n+ amorphous silicon layer 132 being cleaned and seldom remaining on the amorphous silicon layer 131. After finishing the first etching process, proceed the second etching process to the active layer 13, that is, etch the exposed amorphous silicon layer 131. At this time, the power of the source RF of the plasma generating equipment is set for 3000 W, and the power of the bias RF is set for 2500 W, which are lower than the power of the first etching. The second energy of the generated plasma is less than the first energy of that, so that the second etching rate is slower than the first etching rate. The second etching time is set for 15 seconds. After finishing the second etching process, the channel 15 of the switch transistor is formed, and the thickness of the remaining amorphous silicon layer 131 becomes around 950 Å.

In addition to adjust the required power parameters for generating the plasma to control the energy of the plasma, by adjusting the other parameters, which can affect the energy of the plasma, to control the energy of the plasma, allow the second energy is less than the first energy. In particular, it may be chosen according to actual needs.

Through the method mentioned above, the process for etching the active layer 13 comprises two steps, instead of one step. By gradually reducing the desired power of the plasma in the two steps etching process, the energy of the plasma in the second etching process is less than that in the first etching process, which reduces the energy bombarded to the amorphous silicon layer 131 in the second etching process, minimizes the damages to the amorphous silicon layer 131, and then improves the reliability of the switch transistor.

Figure 6:
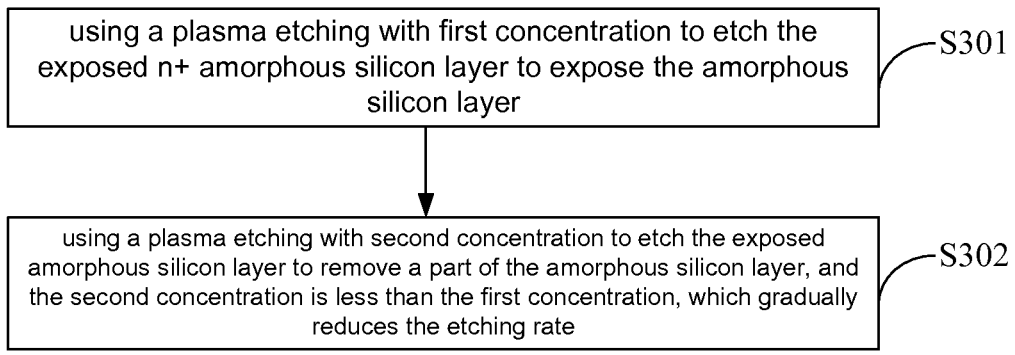
FIG. 6 is a flow chart of the step of proceeding an etching process to the exposed active layer in a way of gradually reducing etching rate according to the other embodiment in FIG. 2.

Moreover, the plasma concentration also affects the etching rate of the plasma. To gradually reduce the etching rate, gradually reducing the plasma concentration can also be used. Specifically, referring to FIG. 6 and accompanying FIG. 5, the step of proceeding an etching process to the exposed active layer 13 in a way of gradually reducing etching rate is as follows.

Step S301: using a plasma etching with first concentration to etch the exposed n+ amorphous silicon layer to expose the amorphous silicon layer.

This step is the first etching process for the active layer 13. The used plasma concentration is first concentration, which etches the exposed n+ amorphous silicon layer 132.

Step S302: using a plasma etching with second concentration to etch the exposed amorphous silicon layer to remove a part of the amorphous silicon layer. The second concentration is less than the first concentration, which gradually reduces the etching rate.

In proceeding the second etching process to the active layer 13 according to the present invention, lower the plasma concentration to etch the exposed amorphous silicon layer 131 using the plasma with concentration lower than the first concentration. Specifically, reduce the plasma concentration by reducing the gas flow of the plasma generated from the plasma generating equipment. When proceeding the second etching process to the active layer 13, the lowered plasma concentration allows the etching rate slower than that in the first etching process.

In addition to lower the gas flow of the etching gas to decrease the plasma concentration, the present invention can also decrease the plasma concentration by lower the chamber pressure for generating plasma, which allows the second concentration is less than the first concentration. It is not limited specifically here.

In proceeding the two steps etching process to the active layer 13 according to the present invention, by lowering the gas flow of the etching gas to decrease the plasma concentration, the second concentration is less than the first concentration. Gradually reducing the etch rate for the active layer 13 can minimize the damages to the amorphous silicon layer 131 and improve the reliability of the switch transistor.

In the embodiment mentioned above, proceeding the dry etching process to the active layer 13 comprises two steps. In this two steps etching process, when proceeding the second etching, it can not only lower the energy of the plasma or the plasma concentration to gradually reduce the etching rate, but also lower the energy of the plasma and the plasma concentration at the same time to realize that, which is not limited specifically. In the other embodiment, three steps etching process can also be used. Specifically, referring FIG. 7 and FIG. 8, the step of proceeding an etching process to the exposed active layer 23 in a way of gradually reducing etching rate is as follows.

Step S401: using a plasma etching with first energy to etch the exposed n+ amorphous silicon layer 232 to expose the amorphous silicon layer 231.

This step is the first etching process for the active layer 23. Corresponding to the step S31 shown in FIG. 7, it mainly removes the n+ amorphous silicon layer 232 to expose the amorphous silicon layer 231.

Step S402: using a plasma etching with second energy to etch the exposed amorphous silicon layer 231 to remove a part of the amorphous silicon layer 231. The second energy is less than the first energy.

Figure 7:
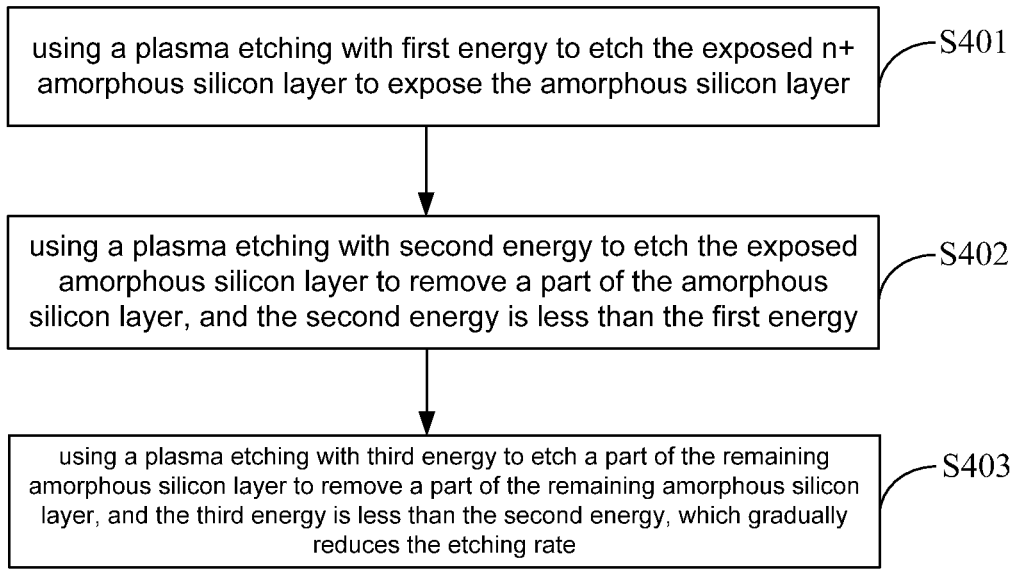
FIG. 7 is a flow chart of the step of proceeding an etching process to the exposed active layer in a way of gradually reducing etching rate according to the further other embodiment in FIG. 2.
Figure 8:
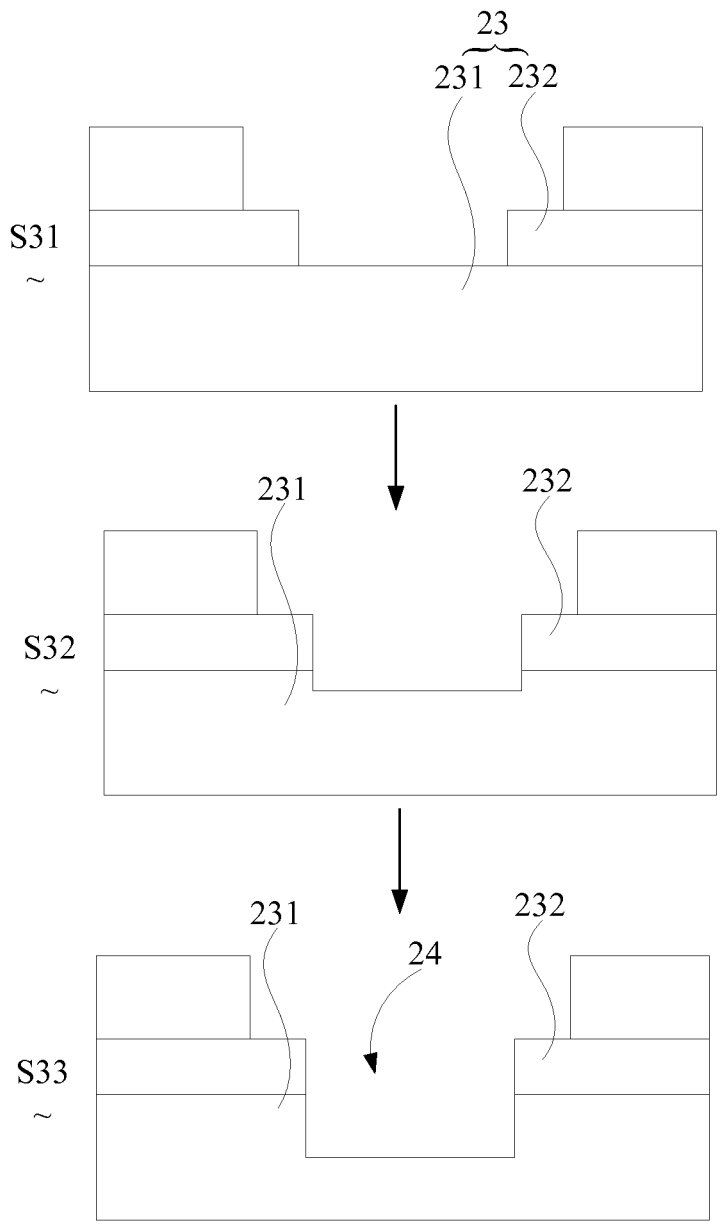
FIG. 8 is a schematic view illustrating the step of proceeding an etching process to the exposed active layer in a way of gradually reducing etching rate in the production of the switch transistor according to the other embodiment of the present invention.

After finishing the first etching process, the plasma with the second energy generated from the plasma generating equipment etches the amorphous silicon layer 231 to remove a part of the amorphous silicon layer 231, as shown in step S32 in FIG. 7. And adjust the related parameters of the plasma generating equipment to decrease the desired power for generating the plasma, which allows the second energy less than the first energy and lowers the etching rate.

Step S403: using a plasma etching with third energy to etch a part of the remaining amorphous silicon layer 231 to remove a part of the remaining amorphous silicon layer 231. The third energy is less than the second energy which gradually reduces the etching rate.

This step is the third etching process for the active layer 23. Corresponding to the step S33 shown in FIG. 7, it mainly removes the remaining amorphous silicon layer 231 to expose a part of the remaining amorphous silicon layer 231, and then form the channel 24 of the switch transistor. Wherein, in the present embodiment, after finishing the second etching process in step S302, further reduce the desired power of the plasma generating equipment for generating the plasma to obtain the plasma with the third energy, which allows the third energy less than the second energy and lowers the energy of the plasma bombarding the remaining amorphous silicon layer 231. It can minimize the damages to the amorphous silicon layer 231 and improve the reliability of the switch transistor.

In the three steps mentioned above, it can also gradually reduce the etching rate by gradually reducing the plasma concentration. The plasma concentration in each step is different, and the plasma concentration in the latter step is less than that in the previous step. The specific implementation refers to the embodiment mentioned above and not be repeated here.

Moreover, in the three steps mentioned above, it can also gradually reduce the etching rate by gradually reducing the energy of the plasma and the plasma concentration at the same time, which is not limited specifically.

Figure 9:
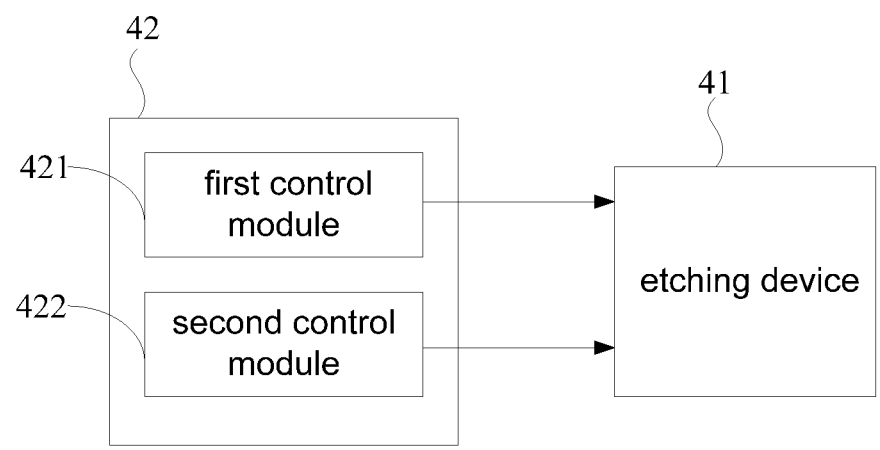
FIG. 9 is a schematic view illustrating the structure of the equipment for etching the switch transistor according to one embodiment of the present invention.

Referring to FIG. 9, one embodiment of the present invention further provides an equipment for etching switch transistor. Wherein, the switch transistor according to the present invention is the switch transistor mentioned above. The etching equipment is used to etch the active layer of the switch transistor in the production of the switch transistor.

Specifically, accompanying the switch transistor shown in FIG. 3, the etching equipment comprises an etching device 41 and a control device 42. The etching device 41 is used to etch the active layer 13 of the switch transistor to form a channel 16 of the switch transistor. The control device 42 is used to control the etching rate of the etching device 41, so that the etching device 41 can etch the active layer 13 in a way of gradually reducing etching rate. Wherein, the active layer 13 comprises an amorphous silicon layer 131 and an n+ amorphous silicon layer 132. The control device 42 is used to control the etching device 41 to generate a plasma with first energy, which is used to etch the n+ amorphous silicon layer 132 to expose the amorphous silicon layer 131. The control device 42 is specifically used to control the etching device 41 to generate a plasma with second energy after exposing the amorphous silicon layer 131, which is used to etch the exposed amorphous silicon layer 131 to remove a part of the amorphous silicon layer. The second energy is less than the first energy, which gradually reduces the etching rate.

Furthermore, the control device 42 comprises a first control module 421 which is used to control the power required for the etching device 41 generating the plasma. After etching the n+ amorphous silicon layer 132, the first control module 421 control the etching device 41 to reduce the required power for generating the plasma, so that the etching device 41 generates the plasma with second energy. The second energy is less than the first energy, which gradually reduces the etching rate.

It can also gradually reduce the etching rate by controlling the etching device 41 to gradually reduce the plasma concentration. At this time, the etching device 41 further comprises a second control module 422, which is used to control the plasma concentration required for the etching device 41 generating the plasma. After etching the n+ amorphous silicon layer 132, the second control module 422 control the etching device 41 to reduce the plasma concentration, so that the etching device 41 generates the plasma with second concentration. The second concentration is less than the first concentration, which gradually reduces the etching rate.

Through the method mentioned above, the equipment for etching the switch transistor according to the present invention etches the active layer 13 of the switch transistor in a way of gradually reducing etching rate, which can minimize the damages to the amorphous silicon layer 131 and improve the reliability of the switch transistor.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A method for preparing switch transistor, comprising:
    sequentially forming a control electrode, an insulation layer, an active layer, and a source/drain metal layer of the switch transistor on a glass substrate, the active layer comprising an amorphous silicon layer adjacent to the insulation layer and an $n^+$ amorphous silicon layer formed on the amorphous silicon layer;
    patterning the source/drain metal layer to expose the $n^+$ amorphous silicon layer and correspondingly forming an input electrode and an output electrode of the switch transistor; and
    proceeding an etching process to the exposed active layer in a way of gradually reducing etching rate to form a channel of the switch transistor, which comprises using a plasma etching with first energy to etch the exposed $n^+$ amorphous silicon layer to expose the amorphous silicon layer, and using a plasma etching with second energy to etch the exposed amorphous silicon layer to remove a part of the amorphous silicon layer; wherein the second energy is less than the first energy, which gradually reduces the etching rate;
    wherein, the etching process is a dry plasma etching, the switch transistor is a thin film transistor, the control electrode of the switch transistor is corresponding to a gate of the thin film transistor, and the input electrode and the output electrode are a source and a drain of the thin film transistor, respectively.

2. The method as claimed in claim 1, wherein the step of using a plasma etching with second energy to etch the exposed amorphous silicon layer comprises:
    reducing the required power of the plasma etching to etch the exposed amorphous silicon layer by the plasma etching with second energy.

3. The method as claimed in claim 1, wherein the step of proceeding an etching process to the exposed active layer in a way of gradually reducing etching rate comprises:
    using a plasma etching with first concentration to etch the exposed $n^+$ amorphous silicon layer to expose the amorphous silicon layer;
    using a plasma etching with second concentration to etch the exposed amorphous silicon layer to remove a part of the amorphous silicon layer; and
    wherein the second concentration is less than the first concentration, which gradually reduces the etching rate.

4. The method as claimed in claim 3, wherein the step of using a plasma etching with second concentration to etch the exposed amorphous silicon layer comprises:
    reducing the gas flow of the etching gas of the plasma etching to etch the exposed amorphous silicon layer by the plasma etching with second concentration.

5. A method for preparing switch transistor, comprising:
    sequentially forming a control electrode, an insulation layer, an active layer, and a source/drain metal layer of the switch transistor on a glass substrate, the active layer comprising an amorphous silicon layer adjacent to the insulation layer and an $n^+$ amorphous silicon layer formed on the amorphous silicon layer;
    patterning the source/drain metal layer to expose the $n^+$ amorphous silicon layer and correspondingly forming an input electrode and an output electrode of the switch transistor; and
    proceeding an etching process to the exposed active layer in a way of gradually reducing etching rate to form a channel of the switch transistor, which comprises using a plasma etching with first energy to etch the exposed $n^+$ amorphous silicon layer to expose the amorphous silicon layer, and using a plasma etching with second energy to etch the exposed amorphous silicon layer to remove a part of the amorphous silicon layer; wherein the second energy is less than the first energy, which gradually reduces the etching rate.

6. The method as claimed in claim 5, wherein the step of using a plasma etching with second energy to etch the exposed amorphous silicon layer comprises:
    reducing the required power of the plasma etching to etch the exposed amorphous silicon layer by the plasma etching with second energy.

7. The method as claimed in claim 5, wherein the step of proceeding an etching process to the exposed active layer in a way of gradually reducing etching rate comprises:
    using a plasma etching with first concentration to etch the exposed $n^+$ amorphous silicon layer to expose the amorphous silicon layer;
    using a plasma etching with second concentration to etch the exposed amorphous silicon layer to remove a part of the amorphous silicon layer; and
    wherein the second concentration is less than the first concentration, which gradually reduces the etching rate.

8. The method as claimed in claim 7, wherein the step of using a plasma etching with second concentration to etch the exposed amorphous silicon layer comprises:
    reducing the gas flow of the etching gas of the plasma etching to etch the exposed amorphous silicon layer by the plasma etching with second concentration.

* * * * *